United States Patent
Choi et al.

(10) Patent No.: US 10,475,859 B2
(45) Date of Patent: Nov. 12, 2019

(54) ORGANIC LIGHT-EMITTING DISPLAY APPARATUS

(71) Applicant: Samsung Display Co., Ltd., Yongin-si, Gyeonggi-do (KR)

(72) Inventors: Wonwoo Choi, Yongin-si (KR); Seungwook Kwon, Yongin-si (KR); Seungho Yoon, Yongin-si (KR); Sangbong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 15/640,017

(22) Filed: Jun. 30, 2017

(65) Prior Publication Data

US 2018/0006096 A1    Jan. 4, 2018

(30) Foreign Application Priority Data

Jun. 30, 2016  (KR) .......................... 10-2016-0083031

(51) Int. Cl.
*H01L 27/32* (2006.01)
*H01L 51/52* (2006.01)

(52) U.S. Cl.
CPC ...... *H01L 27/3223* (2013.01); *H01L 27/3297* (2013.01); *H01L 51/5253* (2013.01); *H01L 27/3244* (2013.01); *H01L 2227/323* (2013.01)

(58) Field of Classification Search
CPC .................................................. H01L 27/3223
See application file for complete search history.

(56) References Cited

U.S. PATENT DOCUMENTS

| | | | | |
|---|---|---|---|---|
| 8,976,356 | B2* | 3/2015 | Komine | H01L 22/12 356/399 |
| 2005/0012228 | A1* | 1/2005 | Hiramatsu | H01L 21/02422 257/797 |
| 2005/0064675 | A1* | 3/2005 | Kim | H01L 21/2026 438/401 |
| 2005/0161836 | A1* | 7/2005 | Yudasaka | H01L 23/544 257/797 |
| 2008/0157082 | A1 | 7/2008 | Yang et al. | |
| 2012/0193626 | A1* | 8/2012 | Wu | H01L 21/31 257/59 |
| 2013/0341598 | A1* | 12/2013 | Chang | C23C 14/12 257/40 |

FOREIGN PATENT DOCUMENTS

| | | |
|---|---|---|
| JP | 2013-138022 A | 7/2013 |
| KR | 10-2005-0028622 A | 3/2005 |
| KR | 10-0788551 B1 | 12/2007 |
| KR | 10-0815761 B1 | 3/2008 |
| KR | 10-2014-0061899 A | 5/2014 |

* cited by examiner

*Primary Examiner* — Eugene Lee
(74) *Attorney, Agent, or Firm* — Lewis Roca Rothgerber Christie LLP

(57) ABSTRACT

An organic light-emitting display apparatus includes: a substrate including a display area and a peripheral area outside the display area; an alignment mark located in the peripheral area; and an insulating film located in the peripheral area and including a first opening through which at least a part of the alignment mark is exposed and a plurality of slits that extend from the first opening.

11 Claims, 8 Drawing Sheets

ORGANIC LIGHT-EMITTING DISPLAY APPARATUS

CROSS-REFERENCE TO RELATED APPLICATION

This application claims priority to and the benefit of Korean Patent Application No. 10-2016-0083031, filed on Jun. 30, 2016, in the Korean Intellectual Property Office, the entire content of which is incorporated herein by reference.

BACKGROUND

1. Field

One or more embodiments relate to an organic light-emitting display apparatus and a method of manufacturing the same, and for example, to a display apparatus that may improve lamination quality of a protective film and a method of manufacturing the display apparatus.

2. Description of the Related Art

Some display apparatus have recently been replaced with portable thin display apparatus. The market for flexible display apparatuses that may be bent or folded by users at any time or flexible display apparatuses, the manufacturing processes of which include a bending or folding operation, has recently been expanded.

Organic light-emitting display apparatuses that are easily made thin have been in the spotlight as such flexible display apparatuses. An organic light-emitting display apparatus is a display apparatus including an organic light-emitting device in a display area, and the organic light-emitting device includes a pixel electrode and a counter electrode that face each other and an intermediate layer between the pixel electrode and the counter electrode and including an emission layer.

When a flexible display apparatus is manufactured by using an organic light-emitting display apparatus, a protective film may be attached to prevent or reduce damage to an emission layer, etc. during a manufacturing process.

SUMMARY

An existing organic light-emitting display apparatus has problems in that an air bubble is trapped around an alignment mark when a protective film is attached, thereby leading to a failure not to recognize the alignment mark in a subsequent process.

One or more embodiments include an organic light-emitting display apparatus that may improve lamination quality of a protective film and a method of manufacturing the organic light-emitting display apparatus.

Additional aspects will be set forth in part in the description which follows and, in part, will be apparent from the description, or may be learned by practice of the presented embodiments.

According to one or more embodiments, an organic light-emitting display apparatus includes: a substrate including a display area and a peripheral area outside the display area; an alignment mark located in the peripheral area; and an insulating film located in the peripheral area and including a first opening through which at least a part of the alignment mark is exposed and a plurality of slits that extend from the first opening.

The first opening may have a shape corresponding to the alignment mark.

An inner surface of the first opening may be spaced apart from an edge of the alignment mark.

The first opening may have a quadrangular shape.

The plurality of slits may extend up to an edge of the substrate.

The alignment mark may have an edge that is inclined downward.

The organic light-emitting display apparatus may further include: a pixel electrode located in the display area; and a thin-film transistor including a conductive pattern that is electrically coupled to (e.g., electrically connected to) the pixel electrode, wherein the alignment mark includes the same (or substantially the same) material as a material of the conductive pattern.

The insulating film may be located over the display area and the peripheral area, wherein the insulating film is located on a lower layer that is located under the pixel electrode and includes a second opening through which at least a central portion of the pixel electrode is exposed.

The organic light-emitting display apparatus may further include a pixel-defining film located in the display area and including a second opening through which at least a central portion of the pixel electrode is exposed, wherein the insulating film includes the same (or substantially the same) material as a material of the pixel-defining film.

The insulating film may be located in the display area and the peripheral area, wherein a portion of the insulating film located in the display area and a portion of the insulating film located in the peripheral area are separate from each other.

The organic light-emitting display apparatus may further include a protective film located on the insulating film.

According to one or more embodiments, a method of manufacturing an organic light-emitting display apparatus includes: preparing a substrate including a display area and a peripheral area outside the display area; forming a conductive layer over the display area and the peripheral area and forming an alignment mark by patterning a portion of the conductive layer located in the peripheral area; forming an insulating film over the display area and the peripheral area; and forming a first opening through which at least a part of the alignment mark is exposed and a plurality of slits that extend from the first opening by patterning the insulating film.

The forming of the alignment mark may include forming a conductive pattern by patterning a portion of the conductive layer located in the display area.

The method may further include: forming a thin-film transistor including a conductive pattern; and forming a pixel electrode that is electrically coupled to (e.g., electrically connected to) the conductive pattern.

The forming of the plurality of slits may include forming a second opening through which at least a central portion of the pixel electrode is exposed by patterning the insulating film.

The forming of the plurality of slits may include patterning the insulating film so that a portion of the insulating film located in the display area and a portion of the insulating film located in the peripheral area are separate from each other.

The method may further include forming a protective film on the insulating film, wherein the forming of the protective film includes attaching the protective film to the insulating film by using a roller.

The plurality of slits may extend in a direction in which the roller or the substrate moves.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
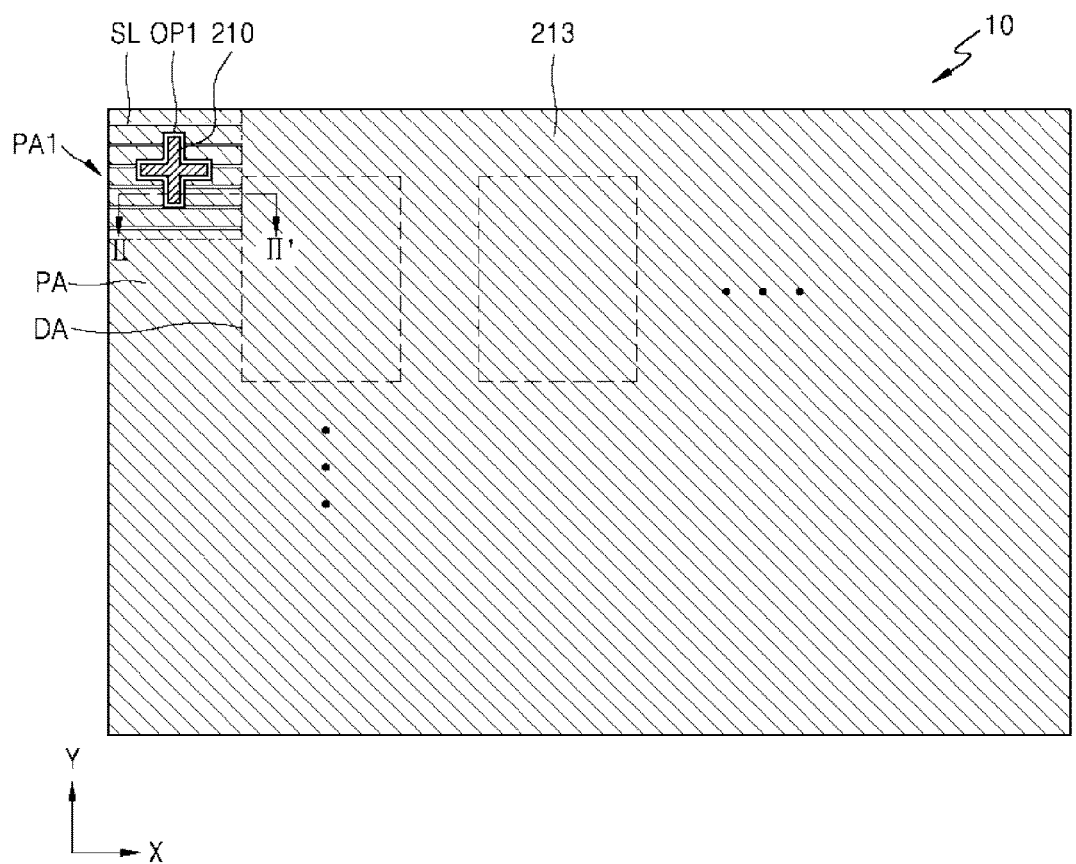
FIG. 1 is a plan view of a mother substrate for manufacturing an organic light-emitting display apparatus according to an embodiment.

As the present disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of related art are omitted when it is deemed that they may unnecessarily obscure the features of the present disclosure.

It will be understood that although the terms "first", "second", etc. may be used herein to describe various components, these components should not be limited by these terms. These terms are only used to distinguish one component from another.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Reference will now be made in detail to embodiments, examples of which are illustrated in the accompanying drawings. In the drawings, the same elements are denoted by the same reference numerals, and a repeated explanation thereof will not be given. In the drawings, thicknesses of layers and regions may be exaggerated for clarity and convenience of explanation.

As used herein, the term "and/or" includes any and all combinations of one or more of the associated listed items. Expressions such as "at least one of" when preceding a list of elements, modify the entire list of elements and do not modify the individual elements of the list.

Figure 2:
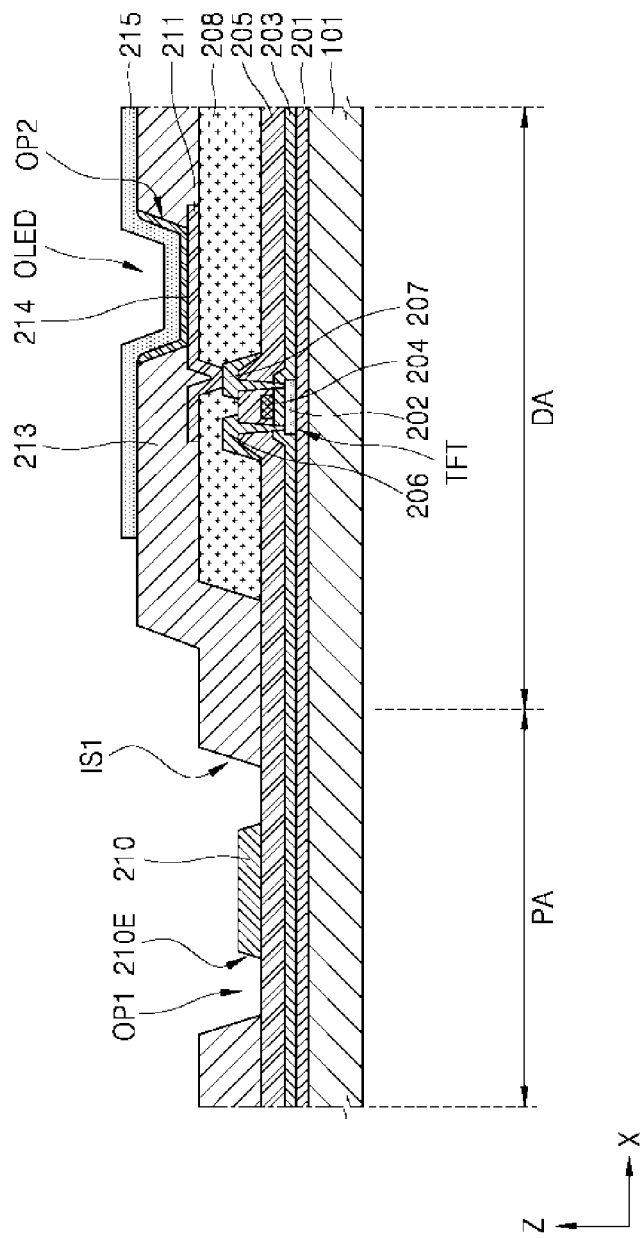
FIG. 2 is a cross-sectional view taken along line II-II' of the mother substrate of FIG. 1.

FIG. 1 is a plan view of a mother substrate 10 for manufacturing an organic light-emitting display apparatus according to an embodiment. FIG. 2 is a cross-sectional view taken along line II-II' of the mother substrate 10 of FIG. 1.

Referring to FIGS. 1-2, the mother substrate 10 of the organic light-emitting display apparatus according to an embodiment includes a plurality of unit display apparatuses. Each of the plurality of unit display apparatuses includes a substrate 101 including a display area DA and a peripheral area PA outside the display area DA, an alignment mark 210 located in the peripheral area PA of the substrate 101, and an insulating film located around the alignment mark 210. In this case, the insulating film may be, for example, a pixel-defining film 213. However, embodiments are not limited thereto, and the insulating film may be an insulating layer or a protective layer other than the pixel-defining film 213. The substrate 101 of FIG. 2 may be a mother substrate or a substrate of a unit display apparatus.

First, a backplane is prepared as shown in FIG. 2. The backplane may include at least the substrate 101, a pixel electrode 211 formed on the substrate 101, and the pixel-defining film 213 through which at least a part including a central portion of the pixel electrode 211 is exposed. In this case, the pixel-defining film 213 may protrude beyond the pixel electrode 211 (in a +Z direction) from the substrate 101. Also, the backplane may further include various other suitable elements. For example, a thin-film transistor (TFT) or a capacitor may be formed on the substrate 101.

The substrate 101 may be formed of any of various suitable materials such as a glass material, a metal material, and/or a plastic material such as polyethylene terephthalate (PET), polyethylene naphthalate (PEN), and/or polyimide.

A buffer layer 201 may be formed on the substrate 101. The buffer layer 201 is formed over an entire (a substantially entire) surface of the substrate 101, that is, over the display area DA and the peripheral area PA. The buffer layer 201, which functions to prevent or reduce penetration of impurity elements through the substrate 101 and to planarize the substrate 101, may be formed of any of various suitable materials to perform such functions.

A TFT may be formed on the buffer layer 201. The TFT may include an active layer 202, a gate electrode 204, a source electrode 206, and a drain electrode 207.

The active layer 202 may be formed of an inorganic semiconductor such as amorphous silicon, poly-silicon, an organic semiconductor, and/or an oxide semiconductor, and includes a source region, a drain region, and a channel region.

A gate insulating film 203 is formed on the active layer 202. The gate insulating film 203 is formed to correspond to the entire (or substantially the entire) substrate 101. In some embodiments, the gate insulating film 203 is formed over the display area DA and the peripheral area PA of the substrate 101. The gate insulating film 203 for insulating the active layer 202 from the gate electrode 204 may be formed of an organic material or an inorganic material such as SiNx or SiO₂.

The gate electrode 204 is formed on the gate insulating film 203. The gate electrode 204 may include gold (Au), silver (Ag), copper (Cu), nickel (Ni), platinum (Pt), palladium (Pd), aluminum (Al), or molybdenum (Mo), and/or an alloy such as Al:Nd and/or Mo:W. However, embodiments are not limited thereto, and the gate electrode 204 may be formed of any of various other suitable materials in consideration of a design condition.

An interlayer insulating film 205 is formed on the gate electrode 204. The interlayer insulating film 205 may be formed to correspond to the entire (or substantially the entire) surface of the substrate 101. In some embodiments, the interlayer insulating film 205 is formed over the display area DA and the peripheral area PA. The interlayer insulating film 205 is located between the gate electrode 204 and the source electrode 206 to insulate the gate electrode 204 from the source electrode 206, and is located between the gate electrode 204 and the drain electrode 207 to insulate the gate electrode 204 from the drain electrode 207. The interlayer insulating film 205 may be formed of an inorganic material such as SiNx and/or $SiO_2$.

In some embodiments, a conductive layer is formed on the interlayer insulating film 205. The conductive layer is formed over the display area DA and the peripheral area PA. Next, a conductive pattern is formed by patterning a portion of the conductive layer located in the display area DA. The conductive pattern may include the source electrode 206 and the drain electrode 207. In more detail, the interlayer insulating film 205 and the gate insulating film 203 are formed to expose the source region and the drain region of the active layer 202, and the source electrode 206 and the drain electrode 207 are formed to contact the exposed source region and drain region of the active layer 202.

Also, the alignment mark 210 is formed by patterning a portion of the conductive layer located in the peripheral area PA. The alignment mark 210 formed outside the display area DA on which an image is formed in order to align the mother substrate 10 in a subsequent process is formed to correspond to the peripheral area PA of the substrate 101. Examples of the subsequent process include a cutting process for forming a unit display apparatus, a process of separating a substrate and a carrier located under the substrate, and a process of attaching a polarizer. As used herein, the term 'subsequent process' refers to a process after a protective film is attached to the substrate 101. The alignment mark 210 may be formed as an inorganic pattern in order to be readily or easily recognized in the subsequent process. In the present embodiment, the alignment mark 210 may be formed of the same (or substantially the same) material as that of the conductive pattern, that is, the source electrode 206 and the drain electrode 207. However, embodiments of the alignment mark are not limited thereto, and various suitable inorganic materials included in the backplane other than the source electrode 206 and the drain electrode 207 may be used to form the alignment mark 210.

The alignment mark 210 may have an edge 210E that is inclined downward (e.g., in a −Z direction). For example, the alignment mark 210 may have an edge 210E that is inclined downward toward the substrate (e.g., the edge 210E may form an oblique angle with the substrate such as an angle that is greater than 90°, or greater than 91°). Accordingly, a stepped portion is smoothly formed when a protective film is attached to the alignment mark 210, and thus the risk of an air bubble or the like trapped around the alignment mark 210 may be reduced. Accordingly, an angle formed between the edge 210E of the alignment mark 210 and the X-axis may range from about 0° to about 45°.

Although the alignment mark 210 has a cross shape in FIG. 1, embodiments of the alignment mark are not limited thereto. For example, the alignment mark 210 may have any of various suitable shapes such as a quadrangular shape, a triangular shape, a polygonal shape, a circular shape, or an elliptical shape, or may have a shape obtained by combining two or more of the above shapes.

The TFT is electrically coupled to (e.g., electrically connected to) an organic light-emitting diode (OLED) to drive the OLED and is covered and protected by a passivation layer 208.

The passivation layer 208 may include an inorganic insulating film and/or an organic insulating film. The inorganic insulating film may include $SiO_2$, SiNx, SiON, $Al_2O_3$, $TiO_2$, $Ta_2O_5$, $HfO_2$, $ZrO_2$, BST, and/or PZT, and the organic insulating film may include a general-purpose polymer such as polymethylmethacrylate (PMMA) or polystyrene (PS), a polymer derivative having a phenol-based group, an acryl-based polymer, and/or an imide-based polymer.

The OLED may be formed on the passivation layer 208, and may include the pixel electrode 211, an intermediate layer 214, and a counter electrode 215.

The pixel electrode 211 is formed on the passivation layer 208. In more detail, the passivation layer 208 may be formed to expose a set (e.g., predetermined) portion of the drain electrode 207 without covering the entire (or substantially the entire) drain electrode 207, and the pixel electrode 211 may be formed to be coupled to (e.g., connected to) the exposed portion of the drain electrode 207. However, embodiments of the pixel electrode are not limited thereto, and the pixel electrode 211 may be coupled to (e.g., connected to) the source electrode 206.

The pixel electrode 211 may be a (semi)transparent electrode or a reflective electrode. When the pixel electrode 211 is a (semi)transparent electrode, the pixel electrode 211 may include indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 211 is a reflective electrode, the pixel electrode 211 may include a reflective film including silver (Ag), magnesium (Mg), aluminum (Al), platinum (Pt), palladium (Pd), gold (Au), nickel (Ni), neodymium (Nd), iridium (Ir), chromium (Cr), and/or a compound thereof (or combination thereof), and a film formed of ITO, IZO, ZnO, and/or $In_2O_3$. As used herein, the terms "combination thereof" and "combinations thereof" may refer to a chemical combination (e.g., an alloy or chemical compound), a mixture, or a laminated structure of components. A configuration and a material of the pixel electrode 211 are not limited thereto and various suitable modifications may be made therein.

The pixel-defining film 213 is an insulating film including a first opening OP1 through which at least a part of the alignment mark 210 is exposed and a second opening OP2 through which a central portion of the pixel electrode 211 or the entire (or substantially the entire) pixel electrode 211 is exposed. The pixel-defining film 213 may define a pixel. Also, the pixel-defining film 213 may prevent an arc or the like from occurring at an end portion of the pixel electrode 211 (or reduce a likelihood or intensity of such an arc or the like) by increasing a distance between the end portion of the pixel electrode 211 and the counter electrode 215 that is located over the pixel electrode 211.

In FIG. 1, the pixel-defining film 213 is formed over the entire (or substantially the entire) surface of the substrate 101, that is, over the display area DA and the peripheral area PA. The first opening OP1 formed in the pixel-defining film 213 may have a shape corresponding to the alignment mark 210. In some embodiments, the first opening OP1 is formed by covering the alignment mark 210 formed on the interlayer insulating film 205 with the pixel-defining film 213 and then patterning the pixel-defining film 213 to correspond to a shape of the alignment mark 210. In this case, an inner surface IS1 of the first opening OP1 may be spaced apart from the edge 210E of the alignment mark 210 so that the first opening OP1 exposes the entire (or substantially the entire) alignment mark 210. Accordingly, a gap may be formed between the edge 210E of the alignment mark 210 and the inner surface IS1 of the first opening OP1 along the edge 210E of the alignment mark 210, and thus the alignment mark 210 may be more clearly recognized.

Also, a plurality of slits LS are formed by patterning a portion of the pixel-defining film 213 that is located in an adjacent area PA1 close to the alignment mark 210. In this case, the plurality of slits SL extend from the first opening OP1 in the +X direction or the −X direction. The extension direction may be substantially parallel to a longitudinal direction of a protective film attached to the alignment mark 210. Accordingly, air remaining around the alignment mark 210 when the protective film is attached to the alignment mark 210 may be discharged to the outside through the plurality of slits SL. Accordingly, the plurality of slits SL may extend up to an edge of the substrate 101 so that air is smoothly discharged. Although the adjacent area PA1 contacts the display area DA in FIG. 1, embodiments of the present disclosure are not limited thereto. For example, the adjacent area PA1 may be spaced apart from the display area DA, and lengths, the number, and a pitch of the plurality of slits SL may be changed in various suitable ways according to a design.

After the backplane is prepared in this manner, the intermediate layer 214 is formed as shown in FIG. 2. The intermediate layer 214 may have a multi-layer structure including an emission layer. In this case, some layers of the intermediate layer 214 may be common layers substantially corresponding to the entire (or substantially the entire) surface of the substrate 101 and other layers of the intermediate layer 214 may be pattern layers patterned to correspond to the pixel electrode 211, unlike in FIG. 2. The intermediate layer 214 may be formed of a low-molecular-weight material or a high-molecular-weight material, and may include a hole injection layer, a hole transport layer, an emission layer, an electron transport layer, and/or an electron injection layer. The intermediate layer 214 may be formed by using any of various suitable methods such as deposition, spin coating, inkjet printing, and/or laser heat transfer.

After the intermediate layer 214 is formed, the counter electrode 215 is formed on the intermediate layer 214. The counter electrode 215 may be a (semi)transparent electrode or a reflective electrode. When the counter electrode 215 is a (semi)transparent electrode, the counter electrode 215 may include a layer formed of a metal having a small work function, for example, lithium (Li), calcium (Ca), LiF/Ca, LiF/Al, aluminum (Al), silver (Ag), magnesium (Mg), and/or a compound thereof (or combination thereof) and a (semi)transparent conductive layer formed of ITO, IZO, ZnO, and/or $In_2O_3$. When the counter electrode 215 is a reflective electrode, the counter electrode 215 may include a layer formed of Li, Ca, LiF/Ca, LiF/Al, Al, Ag, Mg, and/or a compound thereof (or a combination thereof). A configuration and a material of the counter electrode 215 are not limited thereto and various suitable modifications may be made therein.

Figure 3:
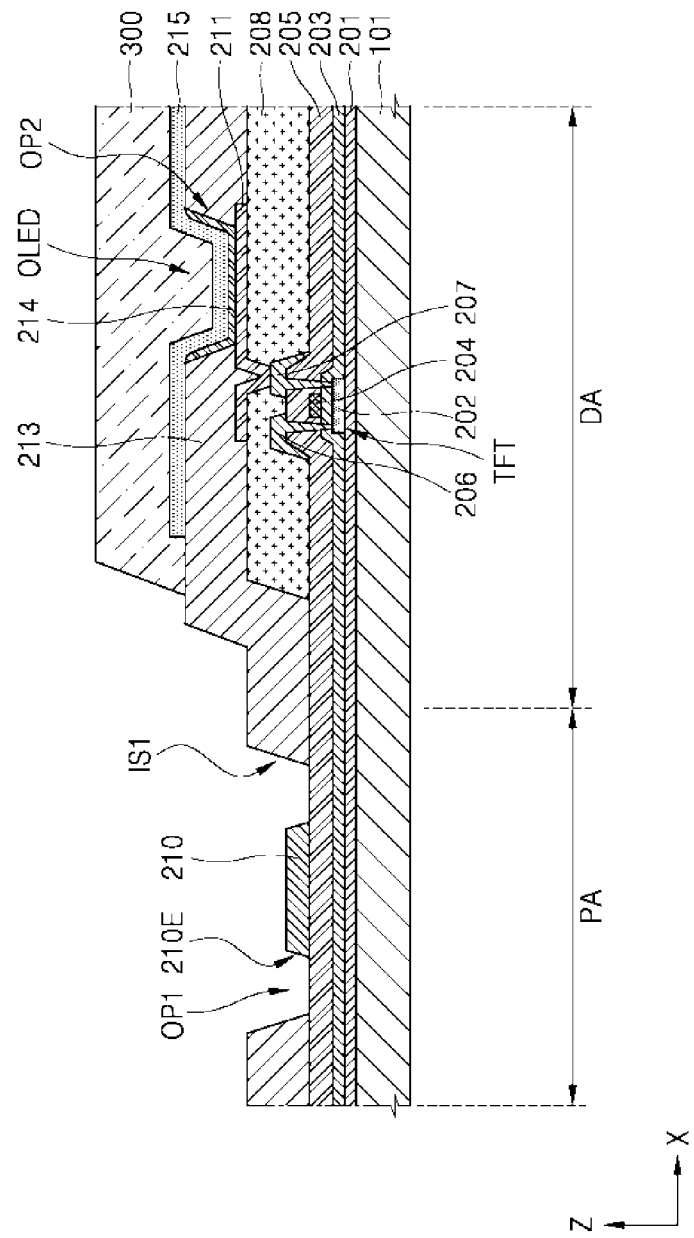
FIGS. 3-5 are cross-sectional views for explaining processes of manufacturing an organic light-emitting display apparatus according to an embodiment.
Figure 4:
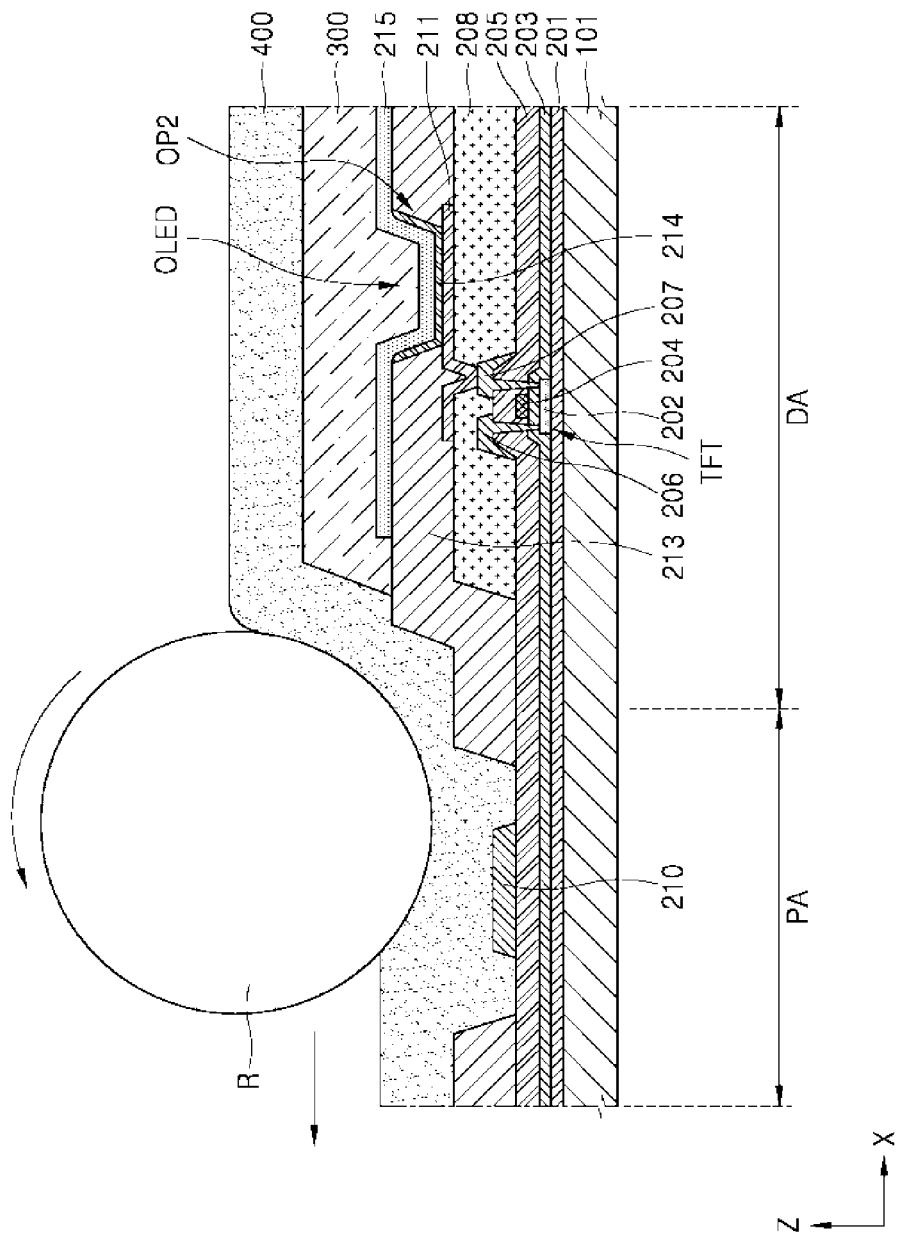
Figure 5:
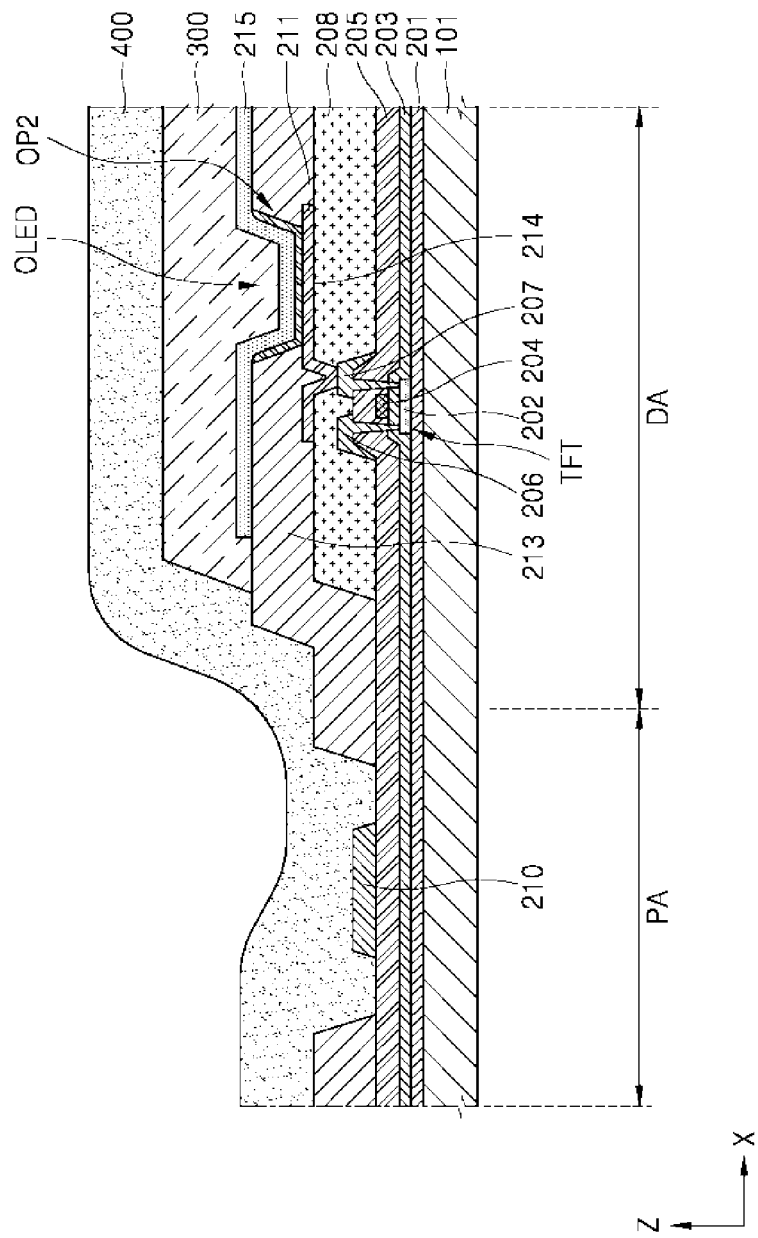

FIGS. 3-5 are cross-sectional views for explaining processes for manufacturing an organic light-emitting display apparatus according to an embodiment.

First, as shown in FIG. 3, after a counter electrode 215 is formed, an encapsulation unit 300 for protecting display devices including pixel electrodes 210R, 210G, and 2106, intermediate layers 220R, 220*g*, and 220B, and the counter electrode 215 from impurities such as external oxygen or moisture is formed. According to an embodiment, the encapsulation layer 300 may include at least one inorganic film and at least one organic film. In more detail, the encapsulation layer 300 may have a structure in which at least one inorganic film and at least one organic film are alternately repeatedly stacked.

Next, as shown in FIG. 4, a protective film 400 is attached to the encapsulation unit 300. The protective film 400 for preventing the intermediate layer 214 and the encapsulation unit 300 from being damaged (or for reducing a likelihood or amount of such damage) during a subsequent process such as a cutting process may be formed to correspond to an entire (or a substantially entire) surface of the substrate 101. For example, the protective film 400 is formed over the display area DA and the peripheral area PA.

The protective film 400 may include a relatively hard polymer material, for example, PET, PEN, polycarbonate, polyarylate, polyetherimide, polyethersulfone, and/or polyimide.

Although the protective film 400 may be attached to the substrate 101 by using any of various suitable methods, in some embodiments, the protective film 400 is attached to the substrate 101 by using a lamination method. When the lamination method is used, a roller R that rotates may apply set (e.g., predetermined) amounts of heat and pressure to the protective film 400 and the protective film 400 may be attached to the substrate 101. In this case, an empty space that is formed between the protective film 400 and the alignment mark 210 may be minimized or reduced by forming the pixel-defining film 213 up to the adjacent area PA1 to reduce a stepped portion formed around the alignment mark 210. Also, in order to provide a path through which air remaining around the alignment mark 210 is discharged, the plurality of slits SL may be patterned in the pixel-defining film 213 to extend in a direction in which the roller R or the substrate 101 moves. Although the roller R moves in a direction (e.g., the −X direction) toward the peripheral area PA when the substrate 101 is fixed in FIG. 4, embodiments of the present disclosure are not limited thereto and, in contrast, the substrate 101 may move in a direction (e.g., the +X direction) toward the display area DA when the roller R is fixed.

Accordingly, as shown in FIG. 5, the protective film 400 may be stably attached to the substrate 101 and an air bubble or the like may not remain (or may substantially not remain) around the alignment mark 210, thereby preventing a failure not to recognize the alignment mark 210 in a subsequent process (or thereby reducing a likelihood of such a failure).

Various embodiments of a mother substrate on which the alignment mark 210 and the pixel-defining film 213 are formed will now be explained in more detail with reference to FIGS. 6-8.

Figure 6:
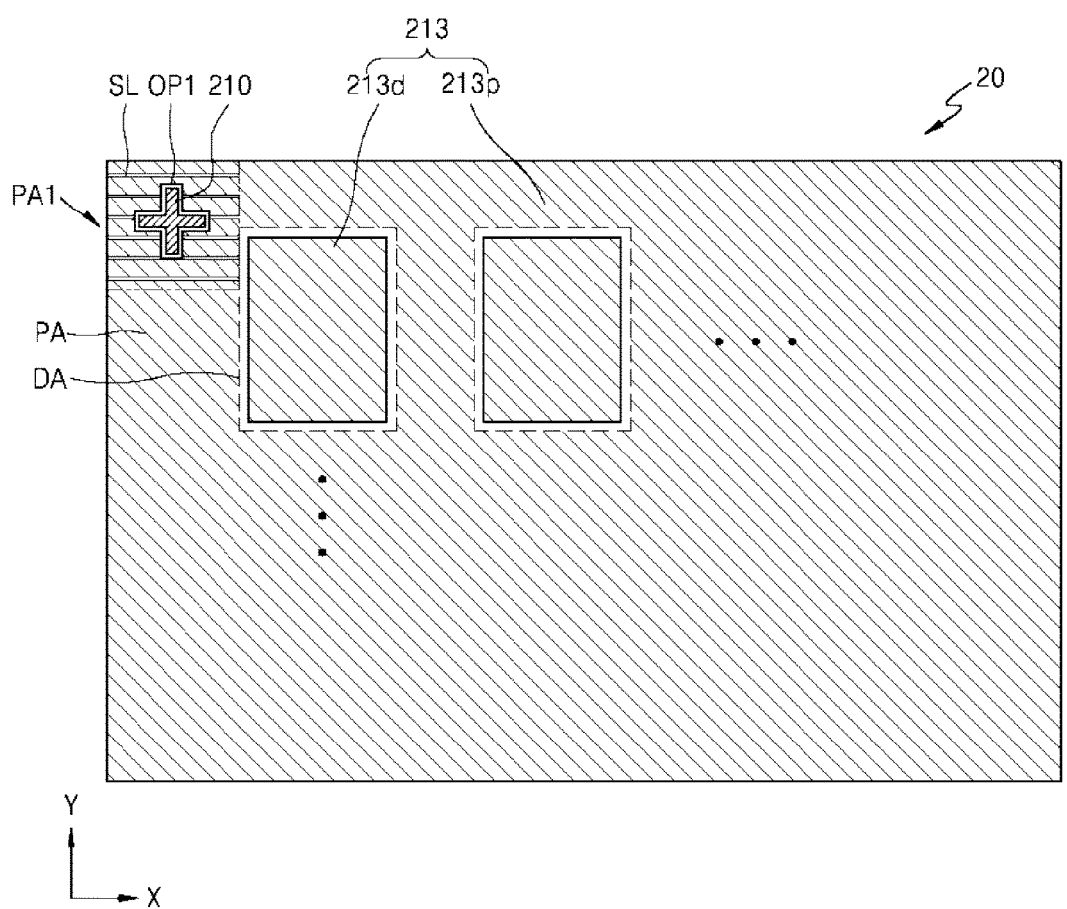
FIG. 6 is a plan view of a mother substrate for manufacturing an organic light-emitting display apparatus according to another embodiment.

FIG. 6 is a plan view of a mother substrate 20 for manufacturing an organic light-emitting display apparatus according to another embodiment. FIG. 7 is a mother substrate 30 for manufacturing an organic light-emitting display apparatus according to another embodiment. FIG. 8 is a mother substrate 40 for manufacturing an organic light-emitting display apparatus according to another embodiment. Embodiments of FIGS. 6-8 are the same as or similar to embodiments of FIGS. 1-5 except structures of the alignment mark 210 and the pixel-defining film 213. Hence, the embodiments of FIGS. 6-8 will now be explained by focusing on the differences from the description above.

First, referring to FIG. 6, the mother substrate 20 of an organic light-emitting display apparatus according to another embodiment includes the alignment mark 210 formed in the peripheral area PA of the substrate 101 and the pixel-defining film 213 formed in the display area DA and the peripheral area PA of the substrate 101.

Like in FIG. 1, the first opening OP1 formed in the pixel-defining film 213 may have a shape corresponding to the alignment mark 210. In this case, an inner surface of the first opening OP1 may be spaced apart from an edge of the alignment mark 210 so that the first opening OP1 exposes the entire (or substantially the entire) alignment mark 210. Accordingly, a gap may be formed between the edge of the alignment mark 210 and the inner surface of the first opening OP1 along the edge of the alignment mark 210, thereby making it possible to more clearly recognize the alignment mark 210.

As described above, the plurality of slits SL that extend in the +X direction or the −X direction from the first opening OP1 are formed in a portion of the pixel-defining film 213 located in the adjacent area PA1. In this case, the plurality of slits SL may extend up to an edge of the substrate 101 in order to smoothly discharge air.

However, unlike in FIG. 1, the pixel-defining film 213 of the present embodiment is not formed over the entire (or substantially the entire) surface of the substrate 101, and is formed so that a first portion 213d of the pixel-defining film 213 located in the display area DA and a second portion 213p of the pixel-defining film 213 located in the peripheral area PA are separate from each other (e.g., are discontiguous). Accordingly, the pixel-defining film 213 is formed over the entire (or substantially the entire) surface of the substrate 101, and then the first opening OP1, the plurality of slits SL, and a gap between the first portion 213d and the second portion 213p are formed by patterning the pixel-defining film 213. In this case, a second opening through which at least a central portion of a pixel electrode is exposed is also formed in the pixel-defining film 213.

Figure 7:
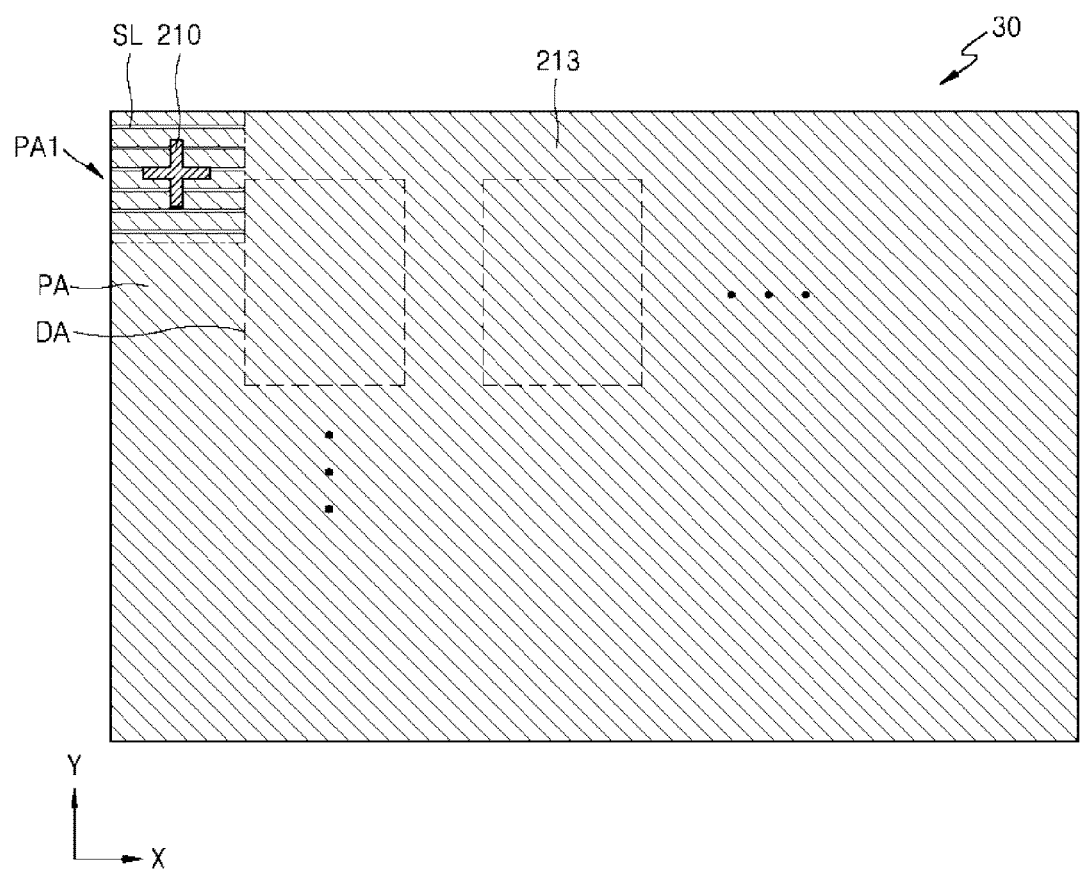
FIG. 7 is a plan view of a mother substrate for manufacturing an organic light-emitting display apparatus according to another embodiment.

Next, referring to FIG. 7, the mother substrate 30 of an organic light-emitting display apparatus according to another embodiment includes the alignment mark 210 formed in the peripheral area PA of the substrate 101 and the pixel-defining film 213 formed in the display area DA and the peripheral area PA of the substrate 101.

Like in FIG. 1, the pixel-defining film 213 is formed over the entire (or substantially the entire) surface of the substrate 101, that is, over the display area DA and the peripheral area PA. Also, the first opening OP1 formed in the pixel-defining film 213 may have a shape corresponding to the alignment mark 210. Also, the plurality of slits SL that extend in the +X direction or the −X direction from the first opening OP1 are formed in a portion of the pixel-defining film 213 located in the adjacent area PA1. In this case, the plurality of slits SL may extend up to an edge of the substrate 101 in order to smoothly discharge air.

However, unlike in FIG. 1, the first opening OP1 is formed to have a size that is the same as or less than that of the alignment mark 210 so that the first opening OP1 exposes a part of the alignment mark 210. Accordingly, in order to easily recognize the alignment mark 210 in a subsequent process, the exposed part of the alignment mark 210 may be formed so that it is not too small. Since a gap is not formed between an edge of the alignment mark 210 and an inner surface of the first opening OP1, an uneven portion around the alignment mark 210 may be further reduced when a protective film is attached.

Figure 8:
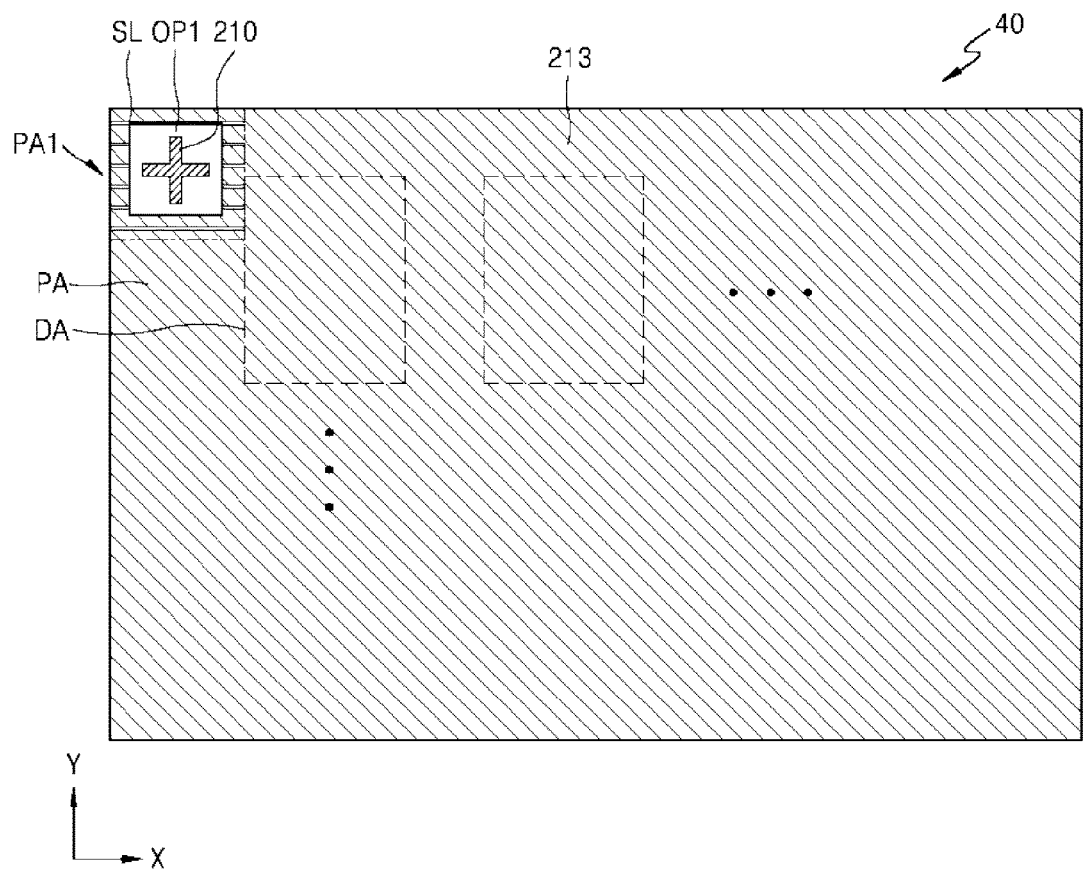
FIG. 8 is a plan view of a mother substrate for manufacturing an organic light-emitting display apparatus according to another embodiment.

Next, referring to FIG. 8, the mother substrate 40 of an organic light-emitting display apparatus according to another embodiment includes the alignment mark 210 formed in the peripheral area PA of the substrate 101 and the pixel-defining film 213 formed in the display area DA and the peripheral area PA of the substrate 101.

Like in FIG. 1, the pixel-defining film 213 is formed over an entire (or substantially the entire) surface of the substrate 101, that is, over the display area DA and the peripheral area PA. Also, the plurality of slits SL are formed in a portion of the pixel-defining film 213 located in the adjacent area PA1 to extend in the +X direction or the −X direction from the first opening OP1. In this case, the plurality of slits SL may extend up to an edge of the substrate 101 in order to smoothly discharge air.

However, unlike in FIG. 1, the first opening OP1 may be formed to have a quadrangular shape. In this case, an inner surface of the first opening OP1 is spaced apart from an edge of the alignment mark 210 so that the first opening OP1 exposes the entire (or substantially the entire) alignment mark 210. Accordingly, a gap may be formed between the edge of the alignment mark 210 and the inner surface of the first opening OP1, thereby making it possible to more clearly recognize the alignment mark 210. Also, since a shape of the first opening OP1 is simply a quadrangular shape, the pixel-defining film 213 may be more easily patterned.

As described above, according to an embodiment, a display apparatus that may improve lamination quality of a protective film and may prevent a failure not to recognize an alignment mark (or may reduce a likelihood of such a failure) and a method of manufacturing the display apparatus may be provided. However, the scope of the present disclosure is not limited by these features.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use,"

"using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. An organic light-emitting display apparatus comprising:
    a substrate comprising a display area and a peripheral area outside the display area;
    an alignment mark located in the peripheral area; and
    an insulating film located in the peripheral area and comprising a first opening through which at least a portion of the alignment mark is exposed and a plurality of slits that extend from the first opening,
    wherein each of the plurality of slits extends from a bottom of the insulating film through a top of the insulating film.

2. The organic light-emitting display apparatus of claim 1, wherein the first opening has a shape corresponding to the alignment mark.

3. The organic light-emitting display apparatus of claim 1, wherein an inner surface of the first opening is spaced apart from an edge of the alignment mark.

4. The organic light-emitting display apparatus of claim 3, wherein the first opening has a quadrangular shape.

5. The organic light-emitting display apparatus of claim 1, wherein the plurality of slits extend up to an edge of the substrate.

6. The organic light-emitting display apparatus of claim 1, wherein the alignment mark has an edge that is inclined downward.

7. The organic light-emitting display apparatus of claim 1, further comprising:
    a pixel electrode located in the display area; and
    a thin-film transistor comprising a conductive pattern that is electrically coupled to the pixel electrode,
    wherein the alignment mark comprises the same material as a material of the conductive pattern.

8. The organic light-emitting display apparatus of claim 7, wherein the insulating film is located over the display area and the peripheral area, and
    wherein the insulating film is located on a lower layer under the pixel electrode and comprises a second opening through which at least a central portion of the pixel electrode is exposed.

9. The organic light-emitting display apparatus of claim 7, further comprising a pixel-defining film located in the display area and comprising a second opening through which at least a central portion of the pixel electrode is exposed,
    wherein the insulating film comprises the same material as a material of the pixel-defining film.

10. The organic light-emitting display apparatus of claim 1, wherein the insulating film is located in the display area and the peripheral area, and
    wherein a portion of the insulating film located in the display area and a portion of the insulating film located in the peripheral area are separate from each other.

11. The organic light-emitting display apparatus of claim 1, further comprising a protective film on the insulating film.

* * * * *